United States Patent
Hsu et al.

(10) Patent No.: US 7,434,195 B2
(45) Date of Patent: Oct. 7, 2008

(54) METHOD FOR PERFORMING FULL-CHIP MANUFACTURING RELIABILITY CHECKING AND CORRECTION

(75) Inventors: Michael Hsu, Hsin-chu (TW); Thomas Laidig, Point Richmond, CA (US); Kurt E. Wampler, Sunnyvale, CA (US); Duan-Fu Stephen Hsu, Fremont, CA (US); Xuelong Shi, San Jose, CA (US)

(73) Assignee: ASML Masktools B.V., Veldhoven (NL)

( * ) Notice: Subject to any disclaimer, the term of this patent is extended or adjusted under 35 U.S.C. 154(b) by 141 days.

(21) Appl. No.: 11/225,888

(22) Filed: Sep. 14, 2005

(65) Prior Publication Data
US 2006/0080633 A1   Apr. 13, 2006

Related U.S. Application Data

(60) Provisional application No. 60/609,243, filed on Sep. 14, 2004.

(51) Int. Cl.
  *G06F 17/50* (2006.01)
  *G06K 9/00* (2006.01)
  *G03F 1/00* (2006.01)
(52) U.S. Cl. .......................... 716/19; 716/21; 382/144; 430/5
(58) Field of Classification Search ................ 716/4–5, 716/19–21; 382/144; 430/5; 700/121
See application file for complete search history.

(56) References Cited

U.S. PATENT DOCUMENTS

| | | | |
|---|---|---|---|
| 4,894,790 A | 1/1990 | Yotsuya et al. |
| 5,097,138 A | 3/1992 | Wakabayashi et al. |
| 5,307,296 A | 4/1994 | Uchida et al. |
| 5,307,421 A | 4/1994 | Darboux et al. |
| 5,319,564 A | 6/1994 | Smayling et al. |
| 5,416,729 A | 5/1995 | Leon et al. |
| 5,621,652 A | 4/1997 | Eakin |
| 5,795,688 A | 8/1998 | Burdorf et al. |

(Continued)

FOREIGN PATENT DOCUMENTS

WO   WO 02/075793 A2   9/2002

OTHER PUBLICATIONS

Hsu, et al., "Full-chip manufacturing reliability check implementation for 90-nm, and 65-nm, nodes using CPL and DDL," Proceedings of SPIE, Apr. 14-16, 2004, pp. 402-413, vol. 5446.

(Continued)

*Primary Examiner*—Stacy A Whitmore
(74) *Attorney, Agent, or Firm*—Pillsbury Winthrop et al.

(57) ABSTRACT

A method of generating a mask for use in an imaging process pattern. The method includes the steps of: (a) obtaining a desired target pattern having a plurality of features to be imaged on a substrate; (b) simulating a wafer image utilizing the target pattern and process parameters associated with a defined process; (c) defining at least one feature category; (d) identifying features in the target pattern that correspond to the at least one feature category, and recording an error value for each feature identified as corresponding to the at least one feature category; and (e) generating a statistical summary which indicates the error value for each feature identified as corresponding to the at least one feature category.

11 Claims, 13 Drawing Sheets

U.S. PATENT DOCUMENTS

| | | | |
|---|---|---|---|
| 5,825,647 | A | 10/1998 | Tsudaka |
| 5,966,312 | A | 10/1999 | Chen |
| 6,081,659 | A | 6/2000 | Garza et al. |
| 6,289,499 | B1 | 9/2001 | Rieger et al. |
| 6,553,559 | B2 | 4/2003 | Liebmann et al. |
| 6,873,720 | B2 | 3/2005 | Cai et al. |
| 6,925,202 | B2 | 8/2005 | Karklin et al. |
| 2002/0026626 | A1 | 2/2002 | Randall et al. |
| 2002/0164064 | A1 | 11/2002 | Karklin et al. |
| 2002/0164065 | A1 | 11/2002 | Cai et al. |
| 2002/0188925 | A1 | 12/2002 | Higashi |
| 2002/0196975 | A1 | 12/2002 | Cahill |
| 2003/0126581 | A1 | 7/2003 | Pang et al. |
| 2003/0219154 | A1 | 11/2003 | Medvedeva et al. |
| 2004/0073885 | A1 | 4/2004 | Ohnuma et al. |
| 2005/0076322 | A1* | 4/2005 | Ye et al. .................. 716/20 |
| 2005/0120327 | A1* | 6/2005 | Ye et al. .................. 716/20 |
| 2005/0142449 | A1* | 6/2005 | Shi et al. .................. 430/5 |
| 2005/0190957 | A1 | 9/2005 | Cai et al. |
| 2005/0235246 | A1* | 10/2005 | Smith et al. .................. 716/21 |

OTHER PUBLICATIONS

Australian Search Report and Written Opinion issued in corresponding Singapore Patent Application No. SG 200505920-9, dated Sep. 1, 2006.

Pati, et al. "Exploiting Structure in Fast Aerial Image Computation for Integrated Circuit Patterns." IEEE Transactions on Semiconductor Manufacturing, Feb. 1997, pp. 62-74, vol. 10, No. 1, IEEE, USA, XP002256517.

Mack, et al. "Metrology, Inspection, and Process Control for Microlithography XV." Proceedings of SPIE, Feb. 26, 2001-Mar. 1, 2001, pp. 377-384, vol. 4344, The International Society for Optical Engineering, XP 008022568.

Cobb, et al. "Mathematical and CAD Framework for Proximity Correction." Optical Microlithography IX, Mar. 13-15, 1996, pp. 208-222, vol. 2726, SPIE, XP008022569.

Crisalle, et al. "A Comparison of the Optical Projection Lithography Simulators in Sample and Prolith." IEEE Transactions on Semiconductor Manufacturing, Feb. 1992, pp. 14-26, vol. 5, No. 1, IEEE.

Gopalarao, et al. "An Integrated Technology CAD System for Process and Device Designers." IEEE Transactions on Very Large Scale Integration (VLSI) Systems, Dec. 1993, pp. 482-490, vol. 1, No. 4, IEEE.

Neubauer, et al. "Imaging VLSI Cross Sections by Atomic Force Microscopy." 1992, pp. 299-303, IEEE/IRPS.

Rodgers. "Application of the Atomic Force Microscope to Integrated Circuit Reliability and Failure Analysis." 1991, pp. 250-254, IEEE/IRPS.

Qian, et al. "A New Scalar Planewave Model for High NA Lithography Simulations." 1994, pp. 45-48, IEEE.

Barouch, et al. "Modeling Process Latitude in UV Projection Lithography." IEEE Electron Device Letters, Oct. 1991, pp. 513-514, vol. 12, No. 10, IEEE.

Beacham, et al. "Applications of an Atomic Force Metrology System in Semiconductor Manufacturing." SPIE, pp. 311-321, vol. 1926.

"AFMs: What Will Their Role Be?" Semiconductor International, Aug. 1993, pp. 62-68.

Prolith/2 User's Manual, Finle Technologies, 1990-1993, Version 3.0 for the Macintosh.

Michael Hsu et al., Full-chip Manufacturing Reliability Check Implementation for 90nm and 65nm Nodes Using CPL™ and DDL™, pp. 402-413, Proc. Of SPIE, vol. 5446.

Michael Hsu et al., Full-chip Manufacturing Reliability Check and Correction (MRC²™)—a First Step toward Design for Manufacturing with Low $k_1$ Lithography, pp. 382-393, XP-002444533, Proc. Of SPIE, vol. 5567.

European Search Report dated Aug. 21, 2007.

Michael Hsu et al., Full-chip Manufacturing Reliability Check Implementation for 90nm and 65nm Nodes Using CPL™ and DDL™, pp. 402-413, Proc. Of SPIE, vol. 5446.

Michael Hsu et al., Full-chip Manufacturing Reliability Check and Correction (MRC²™)—a First Step toward Design for Manufacturing with Low $k_1$ Lithography, pp. 382-393, XP-002444533, Proc. Of SPIE, vol. 5567.

European Search Report dated Aug. 21, 2007.

* cited by examiner

- Special line end pull back adjustment on Par1 and Par2 setting
- Bias correction algorithm was applied on Par3

METHOD FOR PERFORMING FULL-CHIP MANUFACTURING RELIABILITY CHECKING AND CORRECTION

CLAIM OF PRIORITY

This patent application, and any patent(s) issuing therefrom, claims priority to U.S. provisional patent application No. 60/609,243, filed on Sep. 14, 2004, entitled "Full-Chip Manufacturing Reliability Check And Correction ($MRC^2$)", which is incorporated herein by reference in its entirety.

TECHNICAL FIELD

The technical field of the present invention relates generally to a method, program product and apparatus for allowing for the determination earlier on in the design process of whether the target design/layout is manufacturable utilizing a given process, or whether the target design/layout contains "trouble spots" or "weak spots," that would prevent the target design/layout from satisfying the design requirements and/or result in an unsatisfactory yield when manufactured.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

"Assist features" in masks may be used to improve the image projected onto the resist and ultimately the developed device. Assist features are features that are not intended to appear in the pattern developed in the resist but are provided in the mask to take advantage of diffraction effects so that the developed image more closely resembles the desired circuit pattern. Assist features are generally "sub-resolution" or "deep sub-resolution," meaning that they are smaller in at least one dimension than the smallest feature in the mask that will actually be resolved on the wafer. Assist features may have dimensions defined as fractions of the critical dimension. In other words, because the mask pattern is generally projected with a magnification of less than 1, e.g., ¼ or ⅕, the assist feature on the mask may have a physical dimension larger than the smallest feature on the wafer.

Of course, one of the goals in integrated circuit fabrication is to faithfully reproduce the original circuit design on the wafer (via the mask), which is improved with the use of assist features. Another goal is to generate a design layout that is readily manufacturable within specified design tolerances. This is important so that when the device is actually manufactured, the process results in a high yield.

While various rule checking methods have been discussed in the prior art, such as optical rule checking (ORC), these known techniques are difficult and/or unsuitable for use with today's design layouts, which typically include advanced resolution enhancement techniques (RETs). In addition, known rule checking methods do not determine whether or not a given design is readily manufacturable (so as to result in a high yield) early in the design process, thereby often resulting in substantial costs in terms of both time and money associated with the redesign process.

Accordingly, there is a need for method for allowing for the determination of whether or not a design is practical to manufacture early on in the design process so as to minimize the time and costs associated with the redesign process. In addition, there is a need for a manufacturing reliability checking and correction method which is suitable for use with advanced RETs, and which can automatically provide corrections to the design so as to render the resulting device within the specified design tolerances.

SUMMARY OF THE INVENTION

In view of the foregoing, it is an object of the present invention to provide a method for determining earlier on in the design process whether the target design/layout is actually manufacturable utilizing a given process, or whether the target design/layout contains "trouble spots" or "weak spots" that would prevent the target design/layout from satisfy the design requirements and/or result in an unsatisfactory yield when manufactured. In addition, another object of the present invention is to provide a manufacturing reliability checking and correction method which is suitable for use with advanced RETs, and which can automatically provide corrections to the design so as to render the resulting device within the specified design tolerances.

More specifically, the present invention relates to a method of generating a mask for use in an imaging process pattern. The method includes the steps of: (a) obtaining a desired target pattern having a plurality of features to be imaged on a substrate; (b) simulating a printing or wafer image (i.e., simulate the resist patterning) utilizing the target pattern and process parameters associated with a defined process; (c) defining at least one feature category; (d) identifying features in the target pattern that correspond to the at least one feature category, and recording an error value for each feature identified as corresponding to the at least one feature category; and (e) generating a statistical summary which indicates the error value for each feature identified as corresponding to the at least one feature category. In addition, upon identification of the error, the method of the present invention can include the further steps of automatically attempting to correct the error by varying OPC corrective measures and/or varying process parameters by applying predetermined corrective measures stored, for example, in a database. Such a database can be based on a rule-based system, containing various corrections for potential problem areas, which can be applied in a serial manner until an acceptable solution is found. Further, if an acceptable correction measure is identified for a given error, a design rule corresponding to the problem and solution can be recorded in the database and utilized for future corrections/designs.

The method of the present invention provides important advantages over the prior art. Most importantly, the present invention provides a method for performing full-chip manufacturing reliability checking and correction that determines early on in the design process whether or not the target design is actually manufacturable within specified design tolerances. In addition, the method of the present invention can provide for automatic correction of the design so as to produce a design which is manufacturable with specified design tolerances.

Another advantage associated with the present invention is that the full-chip manufacturing reliability checking and correction method is suitable for use with advanced resolution enhancement techniques.

Yet another advantage of the present invention is that the full-chip manufacturing reliability checking and correction method is suitable for use with processes utilizing multiple masks and/or multiple exposures (e.g., DDL vertical and horizontal masks), and multiple data layers in the same mask (e.g., CPL masks including chrome and phase features).

Yet another advantage of the present invention is that the method provides feedback to the designer early in the design process regarding whether the target design contains any "trouble spots" or "weak spots" that would prevent the target design from satisfying the design requirements and/or result in an unsatisfactory yield when subjected to the manufacturing process. As a result, the present invention minimizes the time and costs associated with a redesign process, as well as eliminates the costs associated with tape-out and development of a prototype of a flawed design. In other words, the present invention allows the designer to determine whether or not a design is fundamentally flawed (and therefore non-manufacturable) before the tape-out process and development (i.e., processing) of a test wafer.

In addition, the method of the present invention can, in certain instances, automatically modify the design and/or process so as to address "trouble spots" or "weak spots" in the design.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

Figure 1:
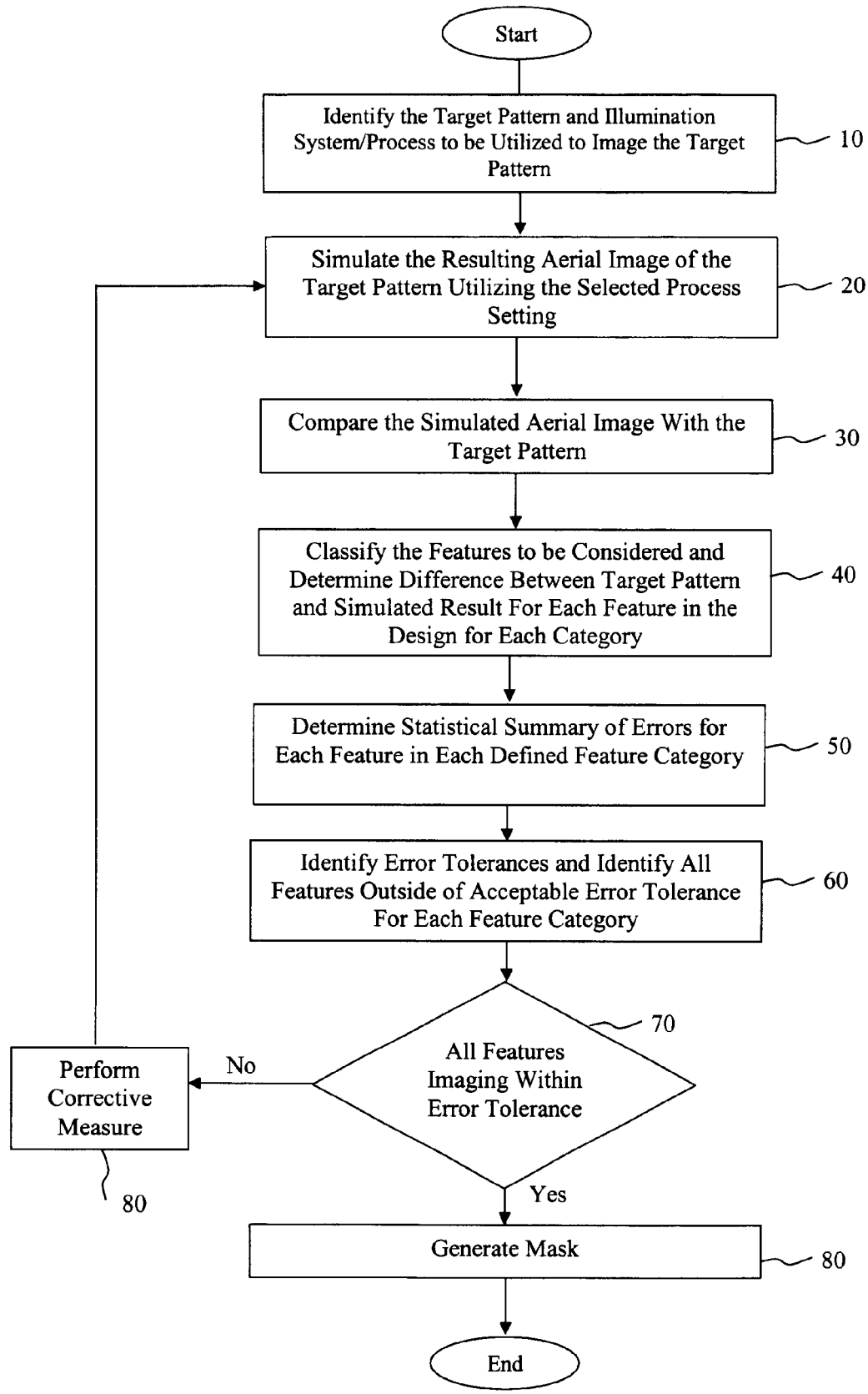
FIG. 1 is an exemplary flowchart illustrating the full-chip manufacturing reliability checking and correction method in accordance with a first embodiment of the present invention.

FIG. 1 is an exemplary flowchart illustrating the full-chip manufacturing reliability checking and correction method in accordance with a first embodiment of the present invention. The first step (Step 10) in the process is to identify the target mask pattern (i.e., the target design) and illumination system and settings (i.e., process conditions) to be utilized to image the pattern.

Figure 2A:
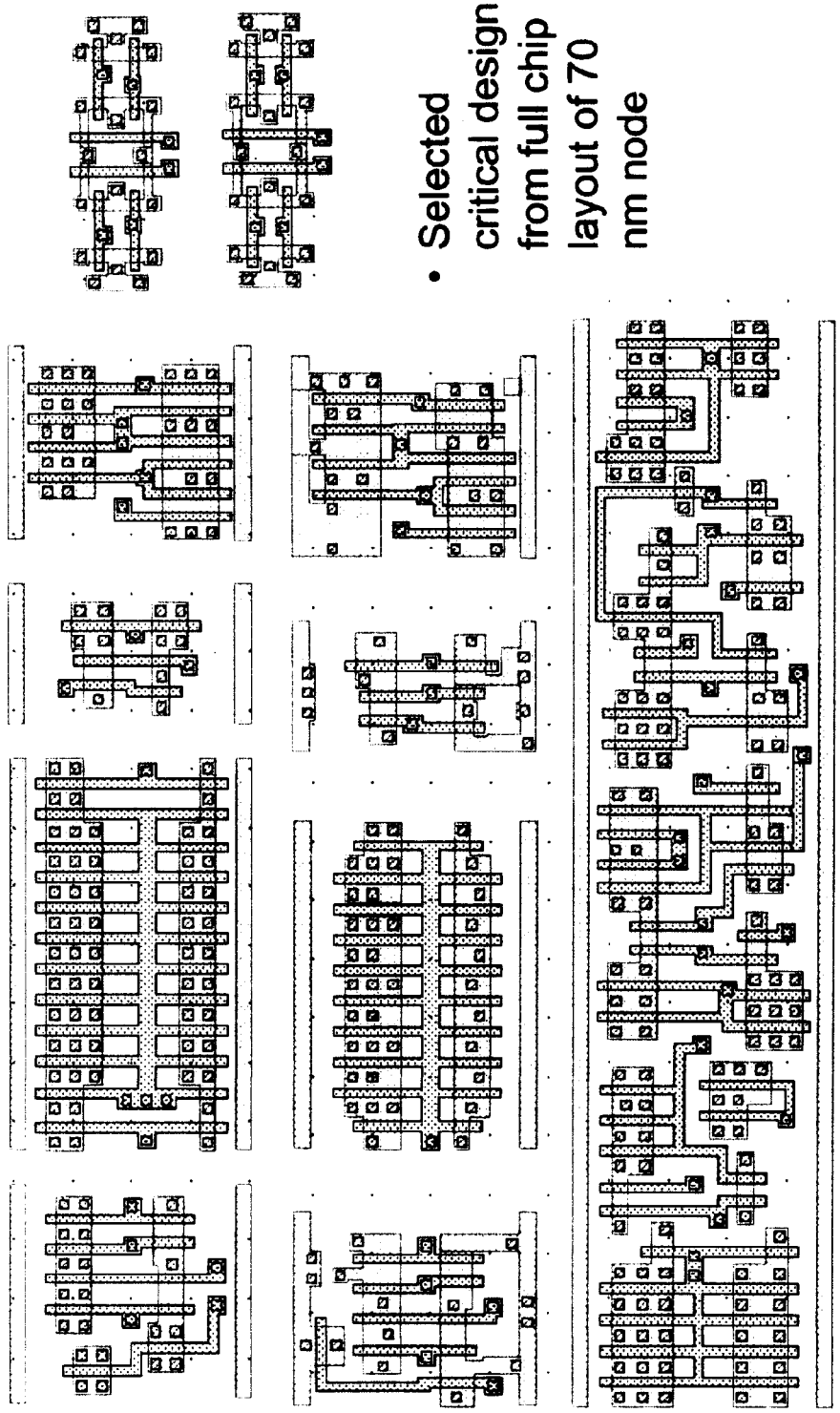
FIGS. 2a and 2b illustrate an exemplary layout pattern (i.e., target pattern) that can be subjected to the checking and correction method of the present invention.
Figure 2B:
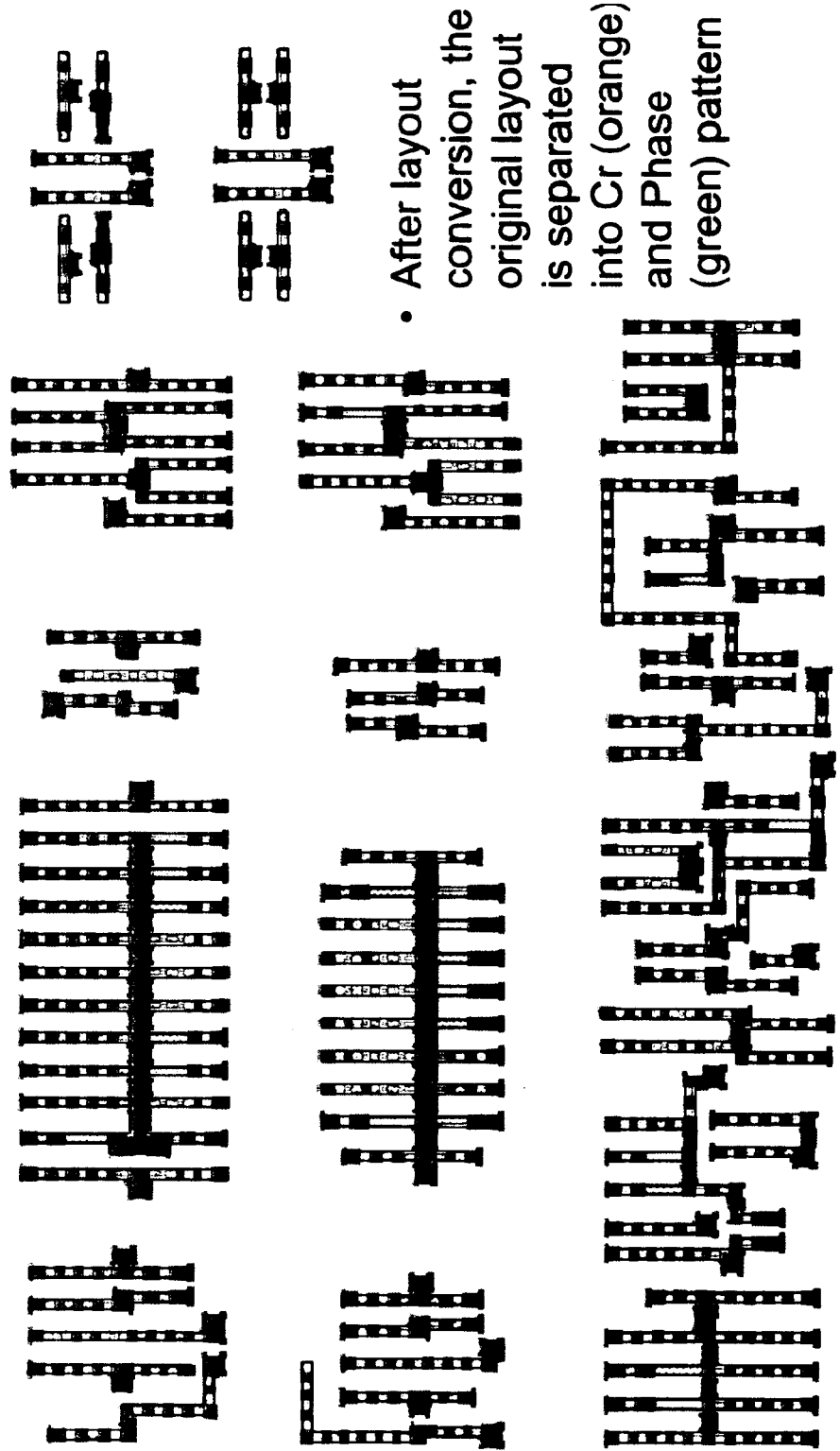

FIGS. 2a and 2b illustrate an exemplary layout pattern (i.e., target pattern) that can be subjected to the checking and correction method of the present invention. More specifically, FIG. 2a represents the full chip layout, while FIG. 2b represents a portion of the layout of FIG. 2a separated into chrome and phase areas in a CPL mask. As noted above, the method of the present invention is suitable for use with processes utilizing multiple masks and/or multiple exposures (e.g., DDL vertical and horizontal masks), and multiple data layers in the same mask (e.g., CPL masks including chrome and phase features).

Once the target pattern is identified, the next step in the process (Step 20) is to simulate the resist patterning contour of the target pattern under production settings (i.e., the desired process), which include manufacturing variations. This simulation can be performed utilizing any known simulation tool, for example, LithoCruiser™, sold by ASML MaskTools, Inc.

The next step (Step 30) is to compare the results of the simulation process to the original target pattern to determine differences between the original target pattern and the simulated resist patterning contour. In the preferred embodiment of the present invention, a full-chip comparison is performed between the simulated result and the target pattern. This process can be performed by comparing the two-dimensional contour of the simulated resist pattern with the two-dimensional contour of the target pattern. Such comparisons of two-dimensional contours are described, for example, in U.S. patent application Ser. No. 10/266,922 filed on Oct. 9, 2002, the contents of which are incorporated by reference herein in its entirety. Alternatively, predefined areas/points of the pattern, preferably expected critical areas, can be compared to determine the differences between the target pattern and the simulated resist pattern. For example, check markers can be included in the target design at locations of critical features, and the comparison is then only performed at the locations of the design including check markers. Such critical areas may include, for example, CD uniformity in narrow lines, convex corners, concave corners, line-ends, etc. This approach allows the process to focus on only those features/areas that the designer expects to be critical or problematic during manufacture. However, in the present embodiment, it is preferable to consider features in all areas of the design layout so that the full-chip design layout is represented. If two-dimensional contours are utilized for the comparison process, the designer can specify the distance between the sampling points about the contour for the comparison process so as to ensure that the full-chip design layout is represented.

Once the comparison is completed and the differences between the simulated result and the target pattern are defined, the next step (Step 40) in the process is to specify/classify the features to be considered and/or analyzed and determine the differences (i.e., errors) between the features in the target design and the simulated result. This entails defining various categories of features to be considered, for example, line-ends, CD uniformity, convex corners, concave corners, etc. Once these categories are defined, the differences between the simulated result and the target pattern are extracted at each position containing a check marker and assigned to one of the predefined categories. In the given example, each difference/error at a given check marker location is assigned/defined as either a line-end error, a CD uniformity error, a convex corner error or a concave corner error and recorded in the respective category. As noted above, it is preferable that the check markers are placed within the layout such that a representation of the full-chip layout is obtained. Alternatively, if a comparison is performed based on two-dimensional contours, the designer must specify the positions of the comparison points about the contours which are to be extracted, which is analogous to defining check markers.

Once Step 40 is completed, the actual differences between the simulated result and the target pattern are known and recorded, and classified into specific types of features categories. It is noted that the categories of features noted above are intended to be exemplary in nature, and not limiting. Additional categories other than those set forth above can be utilized. Furthermore, as also noted above, it is preferably that the number of locations analyzed and recorded are representative of the entire layout. Of course, the actual number of locations considered will vary from layout to layout and depend largely on the number of critical areas deemed to be potential problems in the manufacturing environment.

The next step (Step 50) in the process is to generate a histogram (or any other suitable statistical format) for each feature category and plot the error results for all of the recorded features for each category. Each histogram illustrates how many of the respective features are included in the given category, and the magnitude of the imaging error associated with each feature in the given feature category. As such, the histogram allows the designer to easily determine the number of errors occurring in each defined feature category. Moreover, as explained in more detail below, the histogram allows the designer to determine fairly quickly whether or the local corrections can be utilized to correct unacceptable errors that are out of specification, or if a major redesign is required.

Continuing, the next step (Step 60) in the process is to define acceptable error tolerances for each of the feature categories identified in Step 40, and identify all features in each category that are outside the acceptable error tolerances. As is known, such error tolerances define the variations in the final target pattern that are acceptable (i.e., within design limits). The error tolerances are typically defined by the circuit designer during the initial design stage, and will vary from layout to layout, as well as vary within the layout between different types of features. It is noted that the error tolerances specified by the designer, at a minimum, should correspond to and specify the acceptable errors for the error categories identified in Step 40. As explained in further detail below, it is also possible to superimpose the error tolerances on the various histograms created in Step 50 so as to allow the designer to readily determine the percentage of features in a given category that fall outside the acceptable error tolerance (and therefore must be corrected).

Once the error tolerances have been determined, the next step (Step 70) is to determine whether or not all of the features in each of the categories are within the specified error tolerance for the respective feature. If the answer is YES, the process proceeds to Step 90 and the mask pattern is generated. If the answer is NO, the process proceeds to Step 80, where OPC corrections and/or other corrective measures (i.e., vary process parameters, such as, but not limited to, optical settings, (e.g., NA, Sigma), mask type (e.g., transmission, phase), or resist process) are applied in an effort to eliminate any feature having an associated imaging error outside of the specified error tolerance. Once these corrections are made, the process returns to Step 20 of the foregoing process so as to allow another simulation to be performed, and then proceeds through the process so as to allow for a determination regarding whether or not the correction rendered all features within the specified error tolerances. It is noted that there is no need to re-classify the feature categories or re-define the error tolerances (i.e., Steps 40 and 60) when proceeding through the process the second time, or any other subsequent time.

It is noted that in one embodiment, the foregoing corrections (Step 80) can be performed automatically utilizing predetermined rules (e.g., extending feature lines in areas exhibiting excessive line-end shorting). Such rules would be determined and based on the categories of features being considered in the given process. Indeed, substantially all of the steps of the foregoing method of the present invention can be performed in an automated manner utilizing a computer or dedicated processing device, including the generation of the histograms, which summarize the errors for each individual feature category.

In the given embodiment, a corrective measure database includes two primary methods of correction. The first method entails applying and/or modifying the OPC features applied to the mask design. As noted above, predetermined rules governing the OPC corrective feature to be applied to the mask design to correct given errors are stored in a database and then applied to the mask design if the applicable error is determined to occur (which can be determined from the histogram). The second method entails modifying the given process parameters being utilized. Once again, predetermined rules governing the possible process variations to be attempted upon the occurrence of a given error can be stored in the corrective measure database. Of course, rules requiring an adjustment to both the OPC features and process parameters are also possible. Also, once a solution is determined for a given error condition, the database may be updated to record the correction in the form of a design rule so that it may be applied in future applications. It is also again noted that the instant process is an iterative process, in which the simulation and checking process is re-performed each time an adjustment is made to determine if the adjustment corrected all of the remaining errors. The process is repeated until the system determines an acceptable solution to all pending errors. If after a number of iterations (which can be determined by the operator in advance) the system can not find an acceptable solution, it is likely that a redesign of the mask layout will be necessary.

As noted above, the method of the present invention, which generates histograms for predefined feature categories, is extremely useful for allowing the designer to readily identify and screen out design "weak spots" (and possibly correct such weak spots) for the full-chip layout. In addition, the histogram provides an easy way to determine whether or not adjustments to the processing parameters can be utilized to "tune" slightly out-of-specification designs (i.e., a design having a minimal number of features outside the acceptable error tolerance range). The histogram also allows the designer to determine early in the design process that the proposed design has significant manufacturability issues (e.g., substantially all features in a given error category fall outside the acceptable error) indicating that a substantial redesign of the layout may be required. In other words, the degree and number of errors are such that it is unlikely that process variations and/or OPC corrective measures could be utilized to correct the errors.

Figure 3:
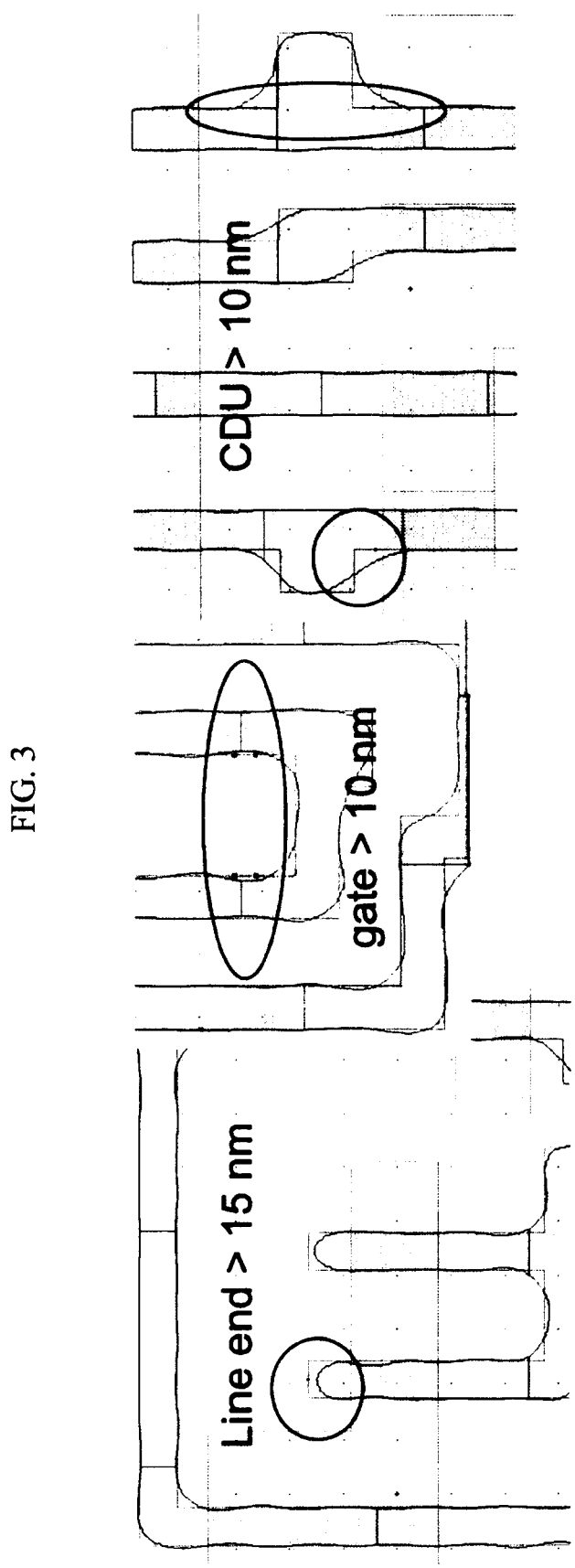
FIG. 3 illustrates an exemplary portion of the target pattern of FIG. 2 overlaid with the simulation result of the same pattern.
Figure 4:
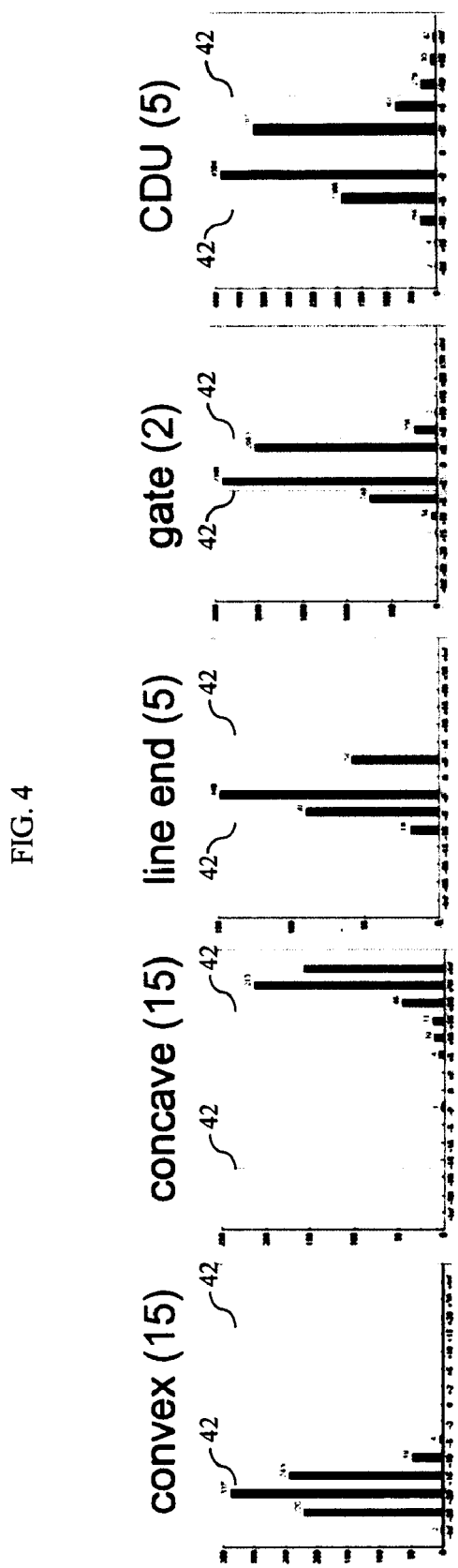
FIG. 4 illustrates exemplary histograms, which were generated based on the differences between the simulation result and the target pattern.

FIG. 3 illustrates an exemplary portion of the target pattern of FIG. 2 overlaid with the simulation result of the same pattern. As can be seen, differences exist between the target pattern and the simulation result. FIG. 4 illustrates exemplary histograms, which were generated based on the differences between the simulation result and the target pattern. In the given example, five categories of features were defined for monitoring, namely, convex features, concave features, line end features, gate width features and critical dimension (i.e., line width) features. Each respective histogram identifies the number of respective features under consideration (i.e., identified with check markers), as well as the degree of error from the target design goal. More specifically, if all of the features being monitored had zero error, each histogram would illustrate a single line located at the center of the histogram (0 on the x-axis in FIG. 4). However, this is typically not the case, as the histograms in the given example illustrate that the respective features have varying degrees of errors in each category. It is further noted that the lines marked 42 in the histogram indicate the acceptable error tolerances. Specifically, any error that falls within these two lines is an acceptable level of deviation from "0" (i.e., no error), and any error that is outside of either of the two lines represents an unacceptable error deviation. Reviewing the histograms of FIG. 4, it can be readily seen that the majority of the convex and concave features being monitored have unacceptable error variations, while the line-end features, the gate features and the CD features are mostly within the specified error tolerance, and are therefore acceptable. FIG. 3 highlights some of the exemplary problem areas within the design.

Figure 5:
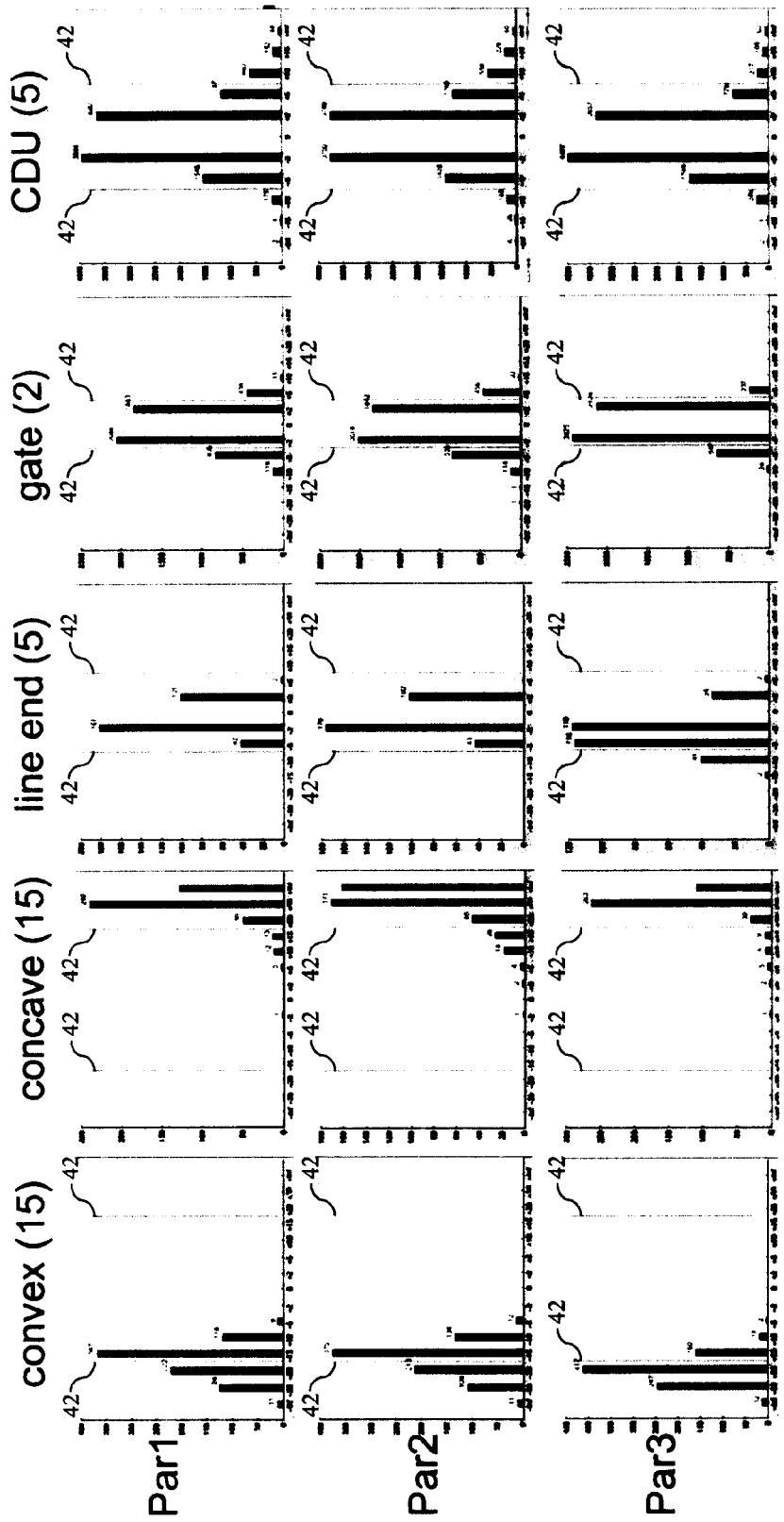
FIG. 5 illustrates histograms for the same layout and same categories as shown in FIG. 4, with the difference being that line end corrections have been applied to the features represented by each of the three sets of histograms of FIG. 5.

FIG. 5 illustrates histograms for the same layout and same categories as shown in FIG. 4, with the difference being that a correction has been applied in each of the three sets of histograms. In the first set (Par 1 and Par 2), a line end pull back adjustment to the features was made. As shown in a comparison between FIG. 4 and FIG. 5, all of the line end features are now within the predefined error tolerance, and therefore should not cause any printing issues during the actual manufacturing process. In Par 3, a bias correction algorithm was applied, however, it did not result in a satisfactory correction of the line end features, as numerous line end feature remain outside the error tolerance. It is noted that Par 1~3, stand for parameter sets 1~3. As noted above, different parameters can be utilized and adjusted to perform various OPC and mask pattern modifications to correct the error. Each parameter set will result in different MRC histogram, some parameter variations may resolve the specific error but result in a reduction in overall performance. It is also possible that a given correction for one type of error, such as line end pull back, will result in the generation of a different type of error, such as CD uniformity becoming worse. By utilizing the histogram of the present invention, it is possible to discern quickly and easily if a given error is likely to be correctable or if a design medication is required.

Figure 6:
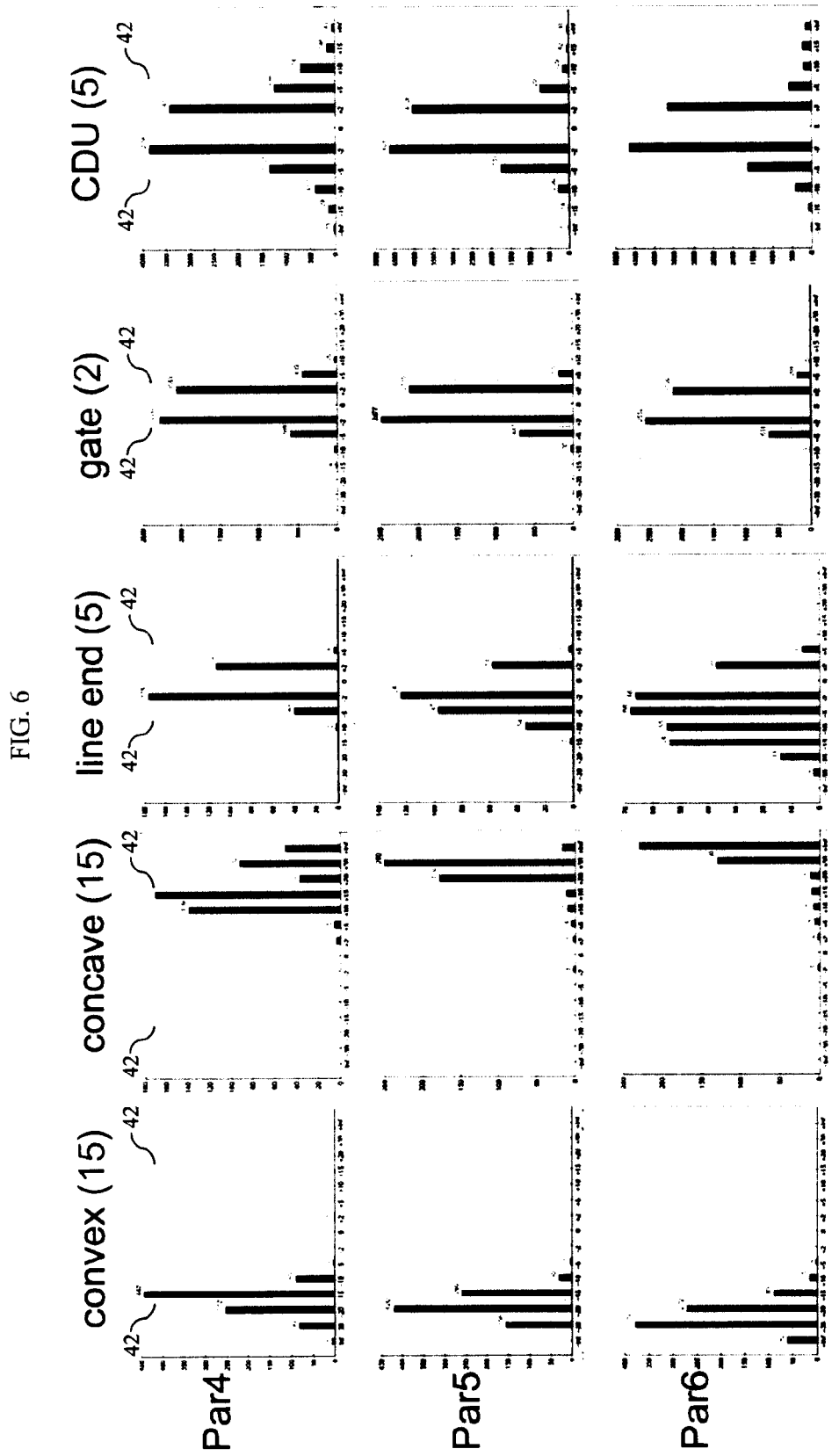
FIG. 6 illustrates histograms for the same layout and same categories as shown in FIG. 4, with the difference being that a concave and convex corner correction has been applied to the features represented by each of the histograms of Par 4 and Par 5, and a line end correction has been applied to the features represented by the histograms of Par 6.

FIG. 6 also illustrates histograms for the same layout and same categories as shown in FIG. 4, with the difference being that a concave and convex corner correction has been applied to the features in each of the histograms of Par 4 and Par 5. As shown in a comparison between FIG. 4 and FIG. 5, the correction performed in Par 4 resulted in a significant improvement in the printing of the concave and convex features, while the correction performed in Par 5 did not. In Par 6, another bias correction algorithm was applied. In the event that the global correction does not render each feature within the specified error tolerance, a local correction (i.e., a correction of only the feature out of tolerance) can be performed by the designer, or automatically by the system. As can be seen from the foregoing figures, the histogram readily indicates whether any of the features of a given category do not comply with the specified error tolerances.

Figure 7:
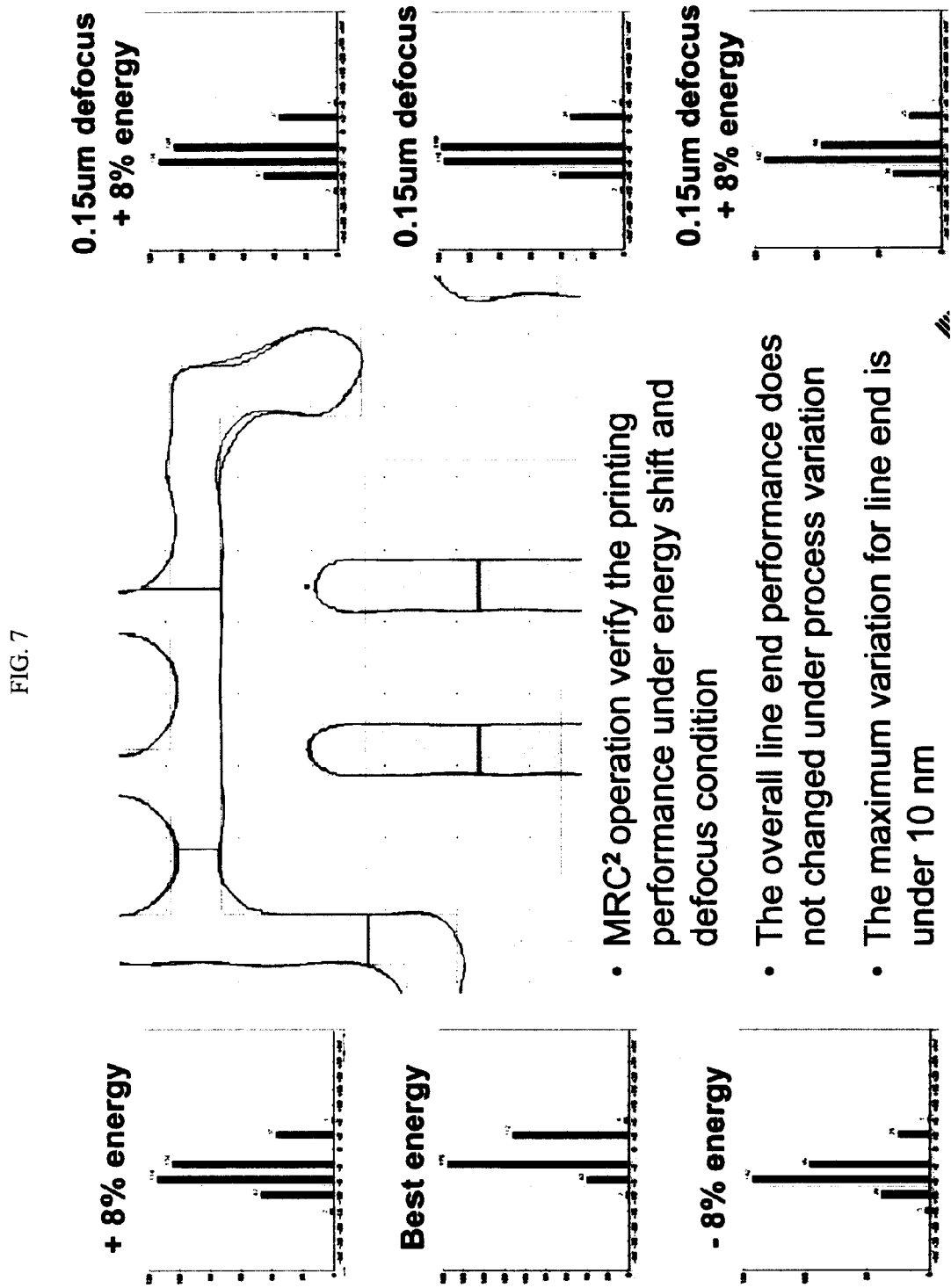
FIGS. 7-9 illustrate histograms indicating that the printing performance of the line-end features, gate features and critical dimensions, respectively, in the given process do not vary much with changes in process parameters.
Figure 8:
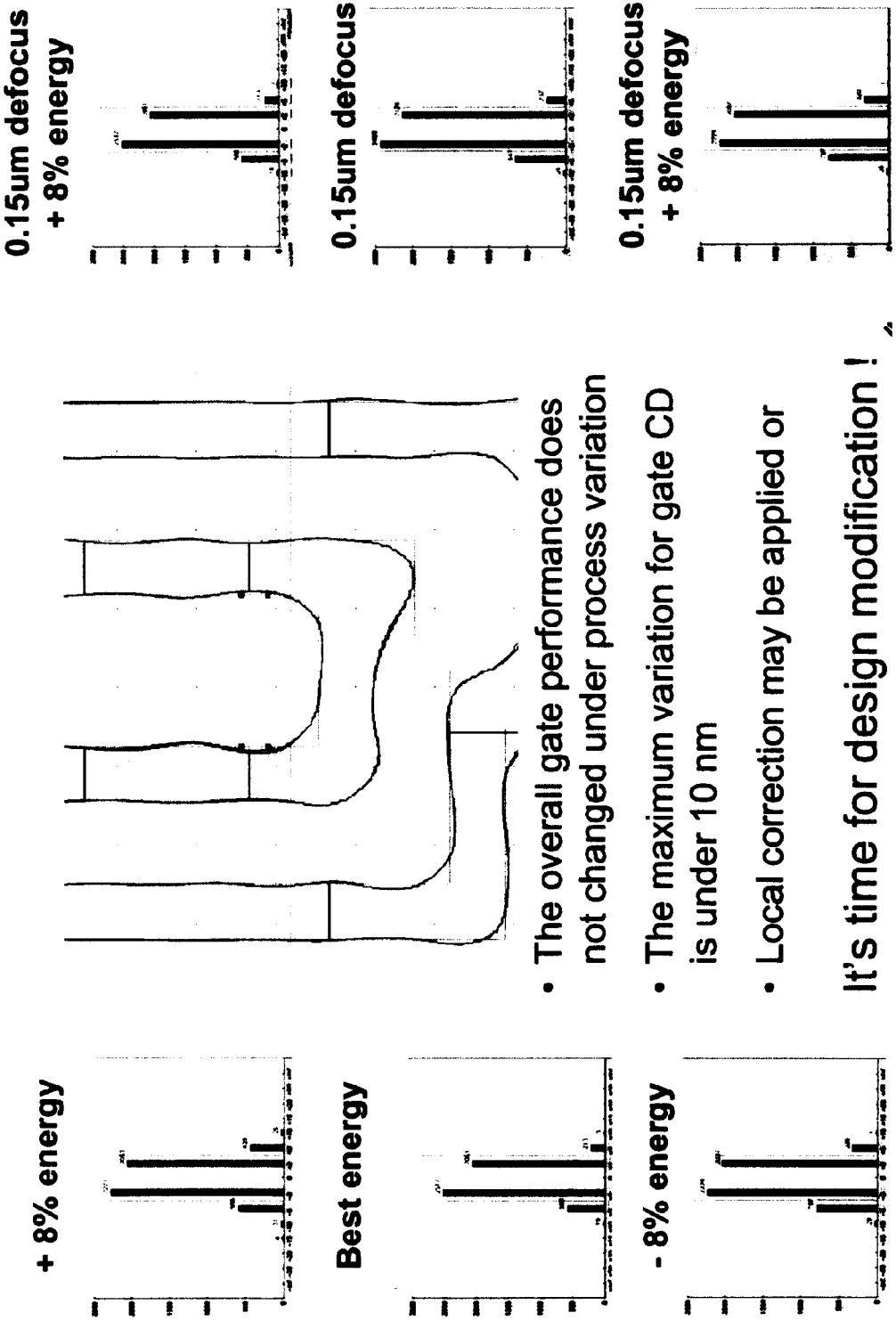
Figure 9:
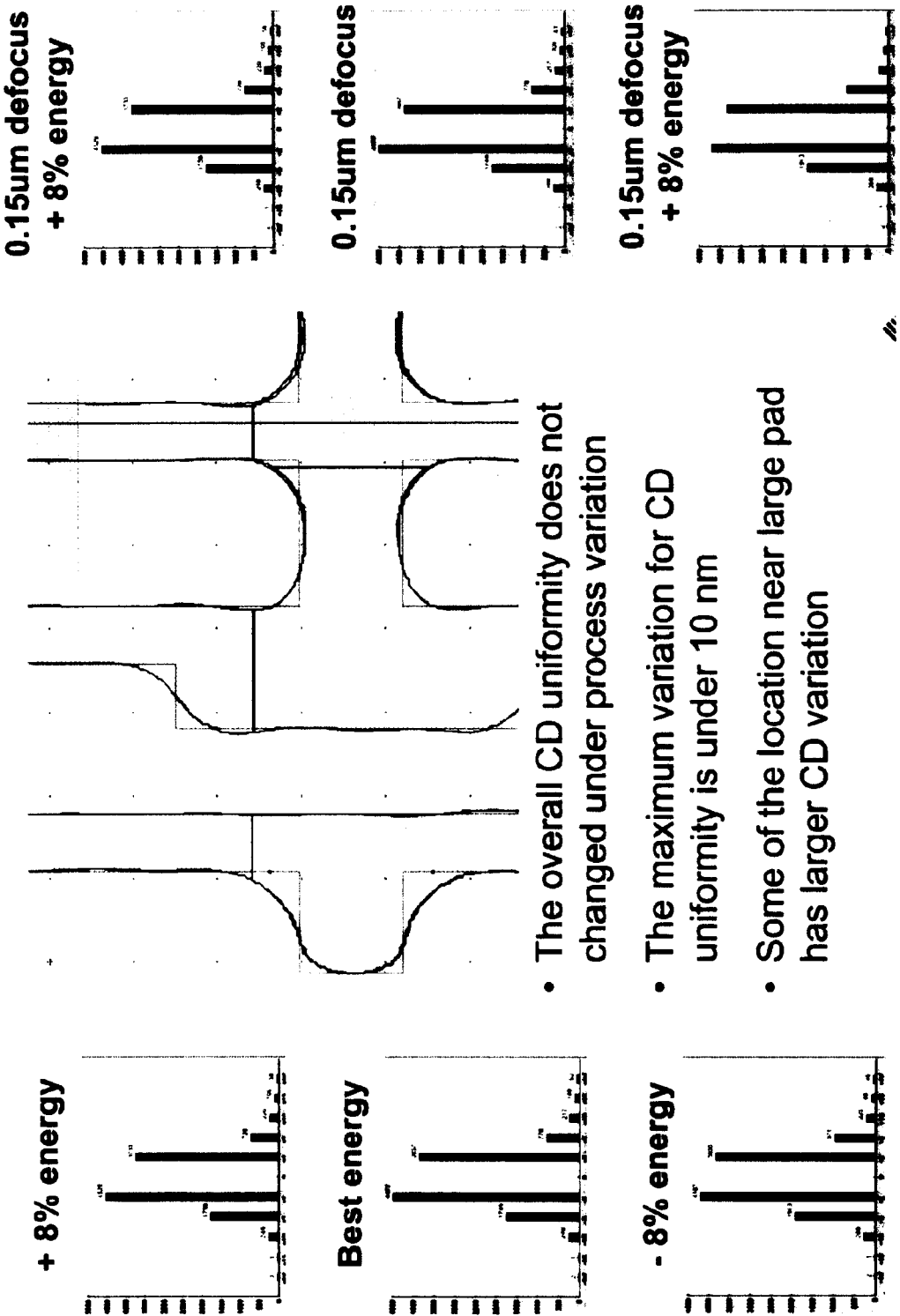

The histograms illustrated in FIGS. 7-9 indicate that the printing performance of the line-end features, gate features and critical dimensions, respectively, in the given process, do not vary much with changes in the dose applied (i.e., energy) or defocus parameters. As shown in each of these figures, the resulting histogram remains relatively unchanged over variations in dose and defocus. Once again, the histogram provides a relatively easy method for the designer to determine whether or not variations in the process settings will achieve the desired corrections in the imaging process of the features. In situations where process variations cannot provide the desired correction, layout modifications may be necessary to satisfy design tolerances.

Figure 11:
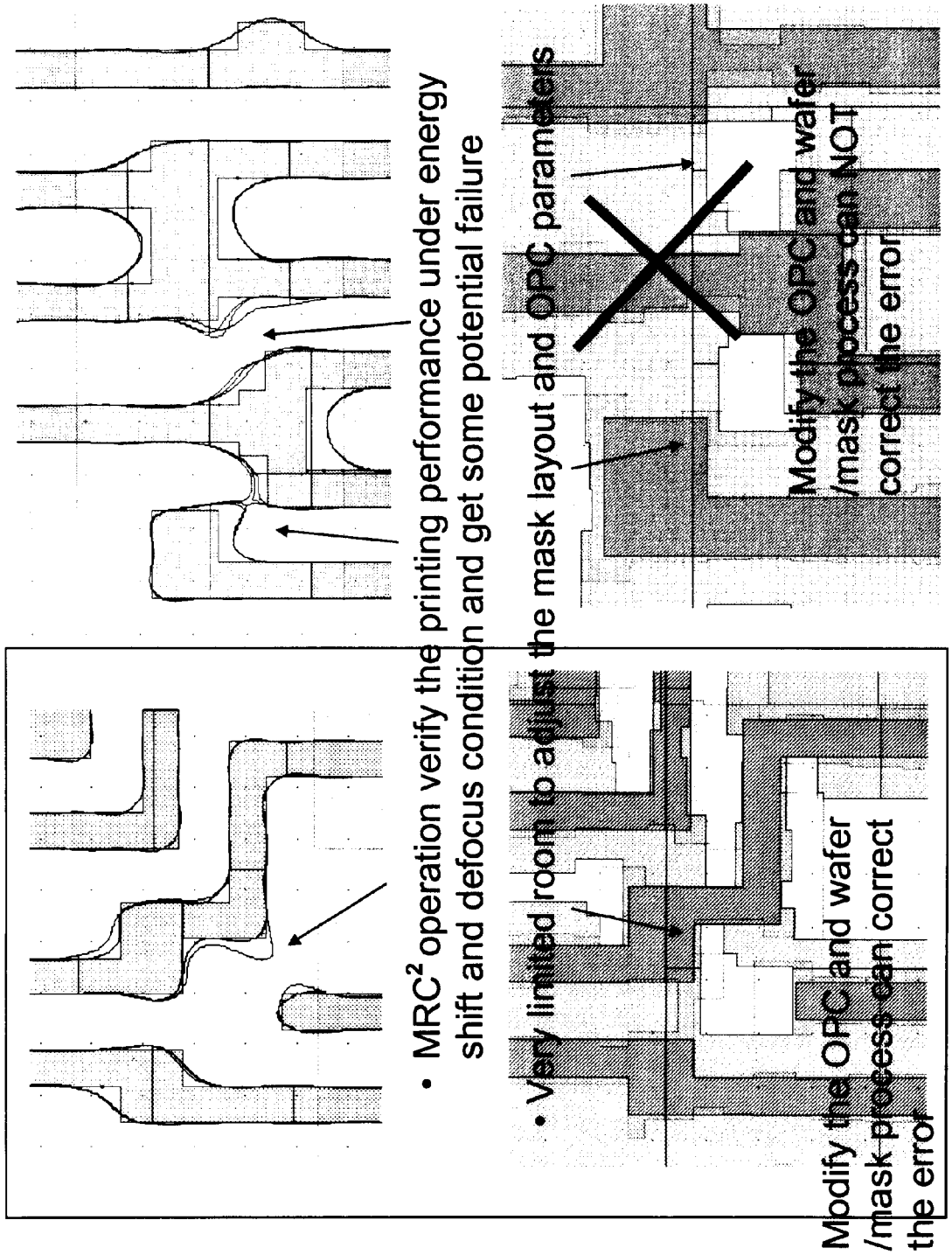
FIGS. 11 and 12 illustrate an example of when a layout modification is required in order to correct an error.
Figure 12:
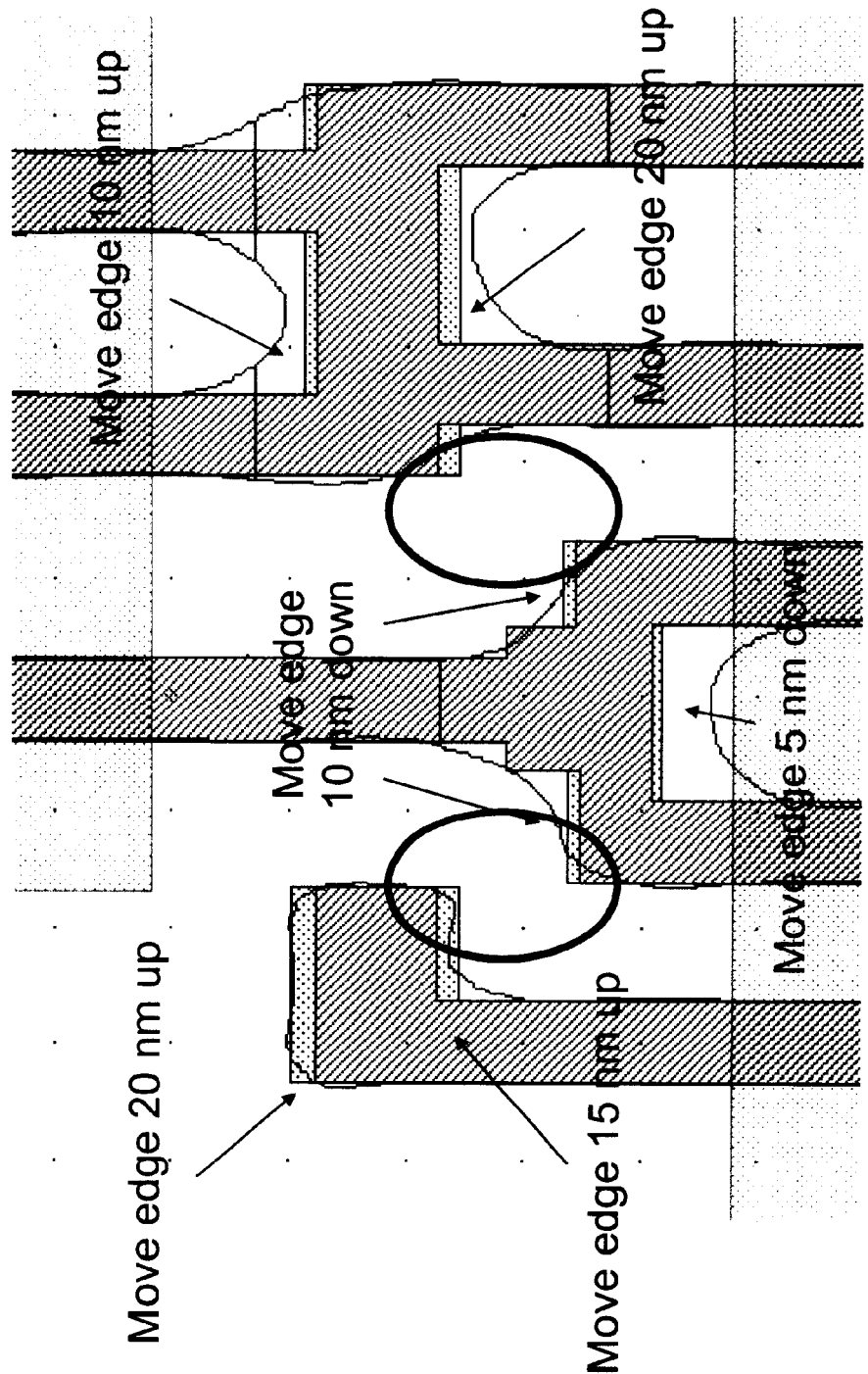

FIGS. 11 and 12 illustrate an example of when a design modification is required in order to correct an error. More specifically, the bottom left-hand side of FIG. 11 illustrates a portion of a layout and the top-right side of the figure illustrates the simulated wafer image superimposed on the target pattern. In this example, the application of OPC measures and process parameter adjustment is sufficient to correct the errors. However, in the right-hand side of FIG. 11, which illustrates another portion of the target circuit and the simulated result, the OPC measures and process parameters variations are insufficient to correct all errors. For example, referring to the top right-hand side of the figure, bridging errors remain after application of the OPC and process parameter corrective measures. As such, a layout modification is necessary. As example of an acceptable layout modification is illustrated in FIG. 12. As indicated in FIG. 12, the edges of various features are further separated from one another to eliminate the bridging error. The simulated result is also illustrated in FIG. 12. As noted above, such layout modifications are typically performed by the circuit designer when they are required. However, it would also be possible to generate a rule-set to provide for automatic correction/modification of the layout design.

As noted above, the method of the present invention provides important advantages over the prior art. Most importantly, the present invention provides a method for performing full-chip manufacturing reliability checking that determines early on in the design process whether or not the target design is actually manufacturable within specified design tolerances. In addition, the method of the present invention can provide for automatic correction of the design so as to produce a design which is manufacturable with specified design tolerances.

Another advantage of the present invention is that the full-chip manufacturing reliability checking and correction method is suitable for use with processes utilizing multiple masks and/or multiple exposures (e.g., DDL vertical and horizontal masks), and multiple data layers in the same mask (e.g., CPL masks including chrome and phase features).

Yet another advantage of the present invention is that the method provides feedback to the designer early in the design process regarding whether the target design contains any "trouble spots" or "weak spots" that would prevent the target design from satisfying the design requirements and/or result in an unsatisfactory yield when subjected to the manufacturing process. As a result, the present invention minimizes the time and costs associated with a redesign process, as well as eliminates the costs associated with tape-out and development of a prototype of a flawed design. In other words, the present invention allows the designer to determine whether or not a design is fundamentally flawed (and therefore non-manufacturable) before the tape-out process and development (i.e., processing) of a test wafer.

In addition, the method of the present invention can provide for automatically modifying the design and/or process so as to address "trouble spots" or "weak spots" in the design in an effort to eliminate/correct features outside of the error tolerance limits.

As mentioned above, the process of the present invention can be performed automatically utilizing a computer or dedicated processor. Furthermore, rules governing the corrections to be performed, including when local corrections are to be made, can be predetermined, and then applied based on the results of the histograms developed by the foregoing method. Indeed, substantially the entire process can be automated if the designer desires to do so. Of course, if the designer desires to be actively involved in the process (e.g., determining the type of corrections to apply), this is also possible.

Figure 10:
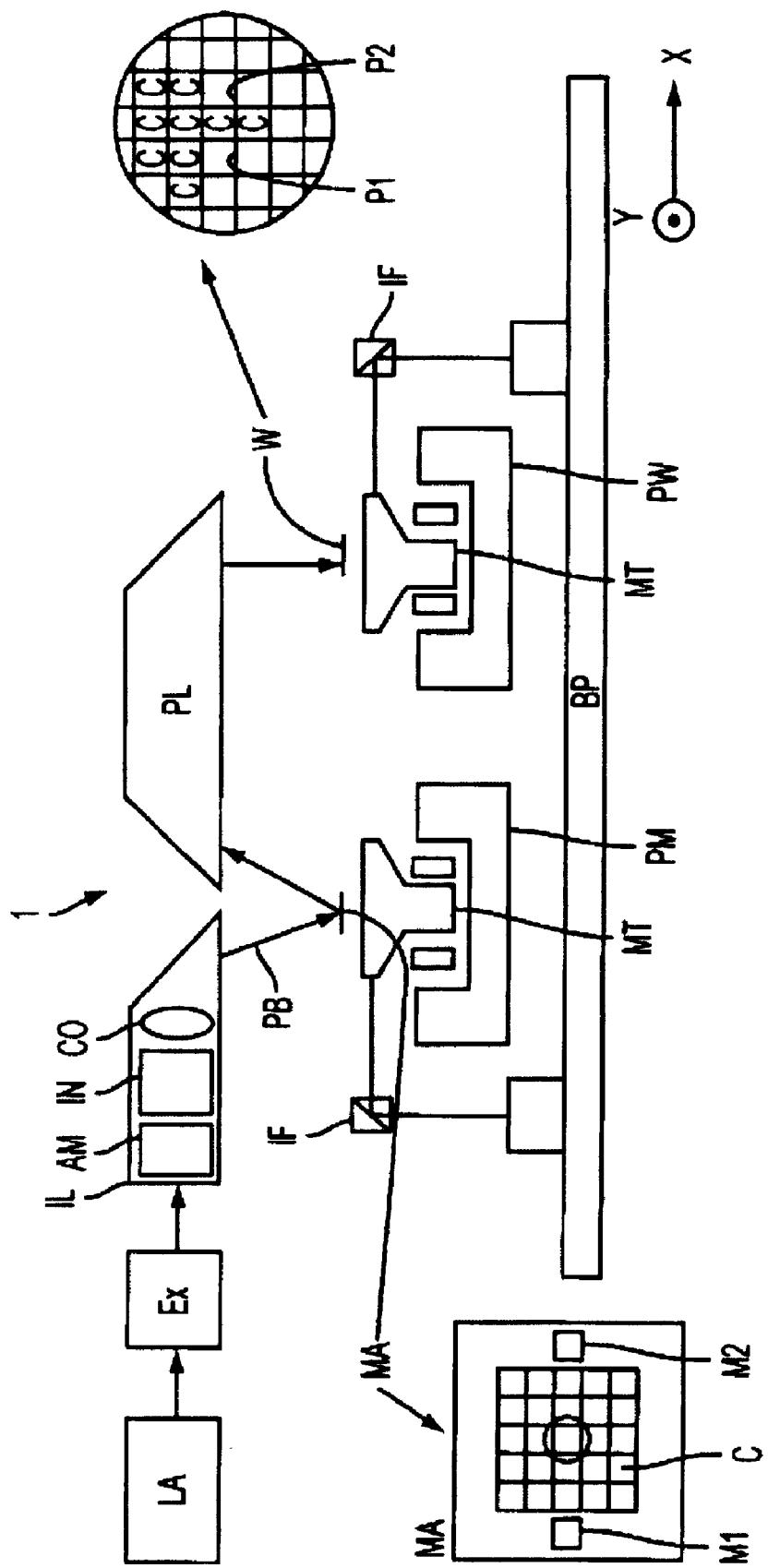
FIG. 10 schematically depicts an exemplary lithographic projection apparatus suitable for use with a mask designed with the aid of the disclosed concepts.

FIG. 10 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 10 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of generating a mask for use in an imaging process, said method comprising the steps of:
    (a) obtaining a desired target pattern having a plurality of features to be imaged on a substrate;
    (b) simulating a wafer image utilizing the target pattern and process parameters associated with a defined process so as to generate simulated imaging results;
    (c) defining a plurality of feature categories;
    (d) identifying features in said target pattern having said plurality of features that correspond to at least one of said plurality of feature categories, determining errors between said simulated imaging results and said target pattern for said identified features, and recording an error value for each feature identified as corresponding to one of said plurality of feature categories; and
    (e) generating a statistical summary for each of said plurality of feature categories, which indicates the error value for each feature identified as corresponding to a given feature category of said plurality of feature categories.

2. The method of claim 1, wherein said error value represents a difference between a location of a feature in said target pattern and the location of the same feature in said simulated wafer image.

3. The method of claim 1 wherein each of the plurality of features in the target design are classified into at least one of said plurality of feature categories.

4. The method of claim 1, further comprising the steps of:
    (f) identifying an error tolerance for features corresponding to one of said plurality of feature categories; and
    (g) determining whether any feature identified as corresponding to one of said plurality of feature categories has an error value which exceeds said error tolerance.

5. The method of claim 4, further comprising the step of performing a corrective measure for any feature identified as having an error value which exceeds said error tolerance, said corrective measure operative to reduce the error value of the corresponding feature below said error tolerance.

6. A computer program product for controlling a computer comprising a recording medium readable by the computer, means recorded on the recording medium for directing the computer to generate files corresponding to a mask for use in a lithographic imaging process, the generation of the files comprising the steps of:
   (a) obtaining a desired target pattern having a plurality of features to be imaged on a substrate;
   (b) simulating a wafer image utilizing the target pattern and process parameters associated with a defined process so as to generate simulated imaging results;
   (c) defining a plurality of feature categories;
   (d) identifying features in said target pattern having said plurality of features that correspond to at least one of said plurality of feature categories, determining errors between said simulated imaging results and said target pattern for said identified features, and recording an error value for each feature identified as corresponding to one of said plurality of feature categories; and
   (e) generating a statistical summary for each of said plurality of feature categories, which indicates the error value for each feature identified as corresponding to a given feature category of said plurality of feature categories.

7. The computer program product of claim 6, wherein said error value represents a difference between a location of a feature in said target pattern and the location of the same feature in said simulated wafer image.

8. The computer program product of claim 6 wherein each of the plurality of features in the target design are classified into at least one of said plurality of feature categories.

9. The computer program product of claim 6, further comprising the steps of:
   (f) identifying an error tolerance for features corresponding to one of said plurality of feature categories; and
   (g) determining whether any feature identified as corresponding to one of said plurality of feature categories has an error value which exceeds said error tolerance.

10. The computer program product of claim 9, further comprising the step of performing a corrective measure for any feature identified as having an error value which exceeds said error tolerance, said corrective measure operative to reduce the error value of the corresponding feature below said error tolerance.

11. A device manufacturing method comprising the steps of:
   (a) providing a substrate that is at least partially covered by a layer of radiation-sensitive material;
   (b) providing a projection beam of radiation using an imaging system;
   (c) using a pattern on a mask to endow the projection beam with a pattern in its cross- section;
   (d) projecting the patterned beam of radiation onto a. target portion of the layer of radiation-sensitive material,
   wherein, in step (c), said mask is formed by a method comprising the steps of:
   obtaining a desired target pattern having a plurality of features to be imaged on a substrate;
   simulating a wafer image utilizing the target pattern and process parameters associated with a defined process so as to generate simulated imaging results;
   defining a plurality of feature categories;
   identifying features in said target pattern having said plurality of features that correspond to at least one of said plurality of feature categories, determining errors between said simulated imaging results and said target pattern for said identified features, and recording an error value for each feature identified as corresponding to one of said plurality of feature categories; and
   generating a statistical summary for each of said plurality of feature categories, which indicates the error value for each feature identified as corresponding to a given feature category of said plurality of feature categories.

* * * * *